US010535482B2

(12) United States Patent
Brandt et al.

(10) Patent No.: US 10,535,482 B2
(45) Date of Patent: Jan. 14, 2020

(54) CALIBRATION AND USE OF MECHANICAL RELAY AT ZERO CROSS

(71) Applicant: TerraLUX, Inc., Longmont, CO (US)

(72) Inventors: Brian Eldin Brandt, Longmont, CO (US); Charles Marvonek, Longmont, CO (US); Jerome Hittle, Longmont, CO (US)

(73) Assignee: LEDVANCE LLC, Wilmington, MA (US)

( * ) Notice: Subject to any disclaimer, the term of this patent is extended or adjusted under 35 U.S.C. 154(b) by 236 days.

(21) Appl. No.: 15/669,681

(22) Filed: Aug. 4, 2017

(65) Prior Publication Data

US 2018/0158633 A1 Jun. 7, 2018

Related U.S. Application Data

(60) Provisional application No. 62/376,136, filed on Aug. 17, 2016.

(51) Int. Cl.
*H01H 47/00* (2006.01)
*G01R 31/327* (2006.01)

(52) U.S. Cl.
CPC ....... *H01H 47/002* (2013.01); *G01R 31/3278* (2013.01)

(58) Field of Classification Search
CPC .......................... H01H 47/002; G01R 31/3278
USPC ........................................................ 361/161
See application file for complete search history.

(56) References Cited

U.S. PATENT DOCUMENTS

| 4,051,394 | A | | 9/1977 | Tieden |
| 4,642,481 | A | | 2/1987 | Bielinski et al. |
| 5,267,120 | A | | 11/1993 | Graff et al. |
| 5,640,113 | A | | 6/1997 | Hu |
| 5,679,986 | A | * | 10/1997 | Iversen ............... H01H 9/56 |
| | | | | 307/125 |
| 5,804,991 | A | | 9/1998 | Hu |
| 8,154,841 | B2 | | 4/2012 | Allen et al. |
| 8,412,973 | B1 | | 4/2013 | Denton et al. |
| 8,559,154 | B2 | | 10/2013 | Li et al. |
| 2012/0262147 | A1 | * | 10/2012 | Wang ............... G01R 31/3278 |
| | | | | 324/76.11 |
| 2015/0028877 | A1 | * | 1/2015 | McCormick ......... H01H 47/002 |
| | | | | 324/418 |
| 2016/0225562 | A1 | * | 8/2016 | Franks ............... H02H 3/006 |
| 2018/0130618 | A1 | * | 5/2018 | Ramirez ............... H01H 9/56 |

* cited by examiner

*Primary Examiner* — Kevin J Comber
(74) *Attorney, Agent, or Firm* — Neugeboren O'Dowd

(57) ABSTRACT

This disclosure describes systems, methods, and apparatus for determining a relay delay for a relay of a relay device used to switch AC power to and from a load. The relay delay can be pre-determined as a model or polynomial including variables for temperature and age, such that the switching instructions can be sent to the rely a relay delay before a zero crossing of the AC signal that the relay is switching, and where the relay delay accounts for temperature and age of the relay in real time or near real time.

12 Claims, 13 Drawing Sheets

CALIBRATION AND USE OF MECHANICAL RELAY AT ZERO CROSS

CLAIM OF PRIORITY UNDER 35 U.S.C. § 119

The present application for patent claims priority to Provisional Application No. 62/376,136 entitled "CALIBRATION AND USE OF MECHANICAL RELAY AT ZERO CROSS" filed Aug. 17, 2016, and assigned to the assignee hereof and hereby expressly incorporated by reference herein.

FIELD OF THE DISCLOSURE

The present invention relates to systems, methods, and apparatus for controlling the operation of a relay. More specifically, the present invention relates to switching a relay ON and OFF at or near the zero-crossing point of an AC waveform.

DESCRIPTION OF RELATED ART

Relays are used to switch many electrical appliances ON and OFF connecting and disconnecting the appliance from an AC power source, respectively, in response to a control signal. One category of electrical appliances that are commonly controlled by relays are electronic ballasts that are switched ON and OFF in response to a sensing device such as a motion detector.

When switching an electrical appliance such as an electronic ballast or an incandescent light ON and OFF with a relay, relay contact must be made at or near specific points along the AC voltage waveform—the zero crossing points. If contact is made or broken at random points along the AC voltage waveform, contact may be made when the waveform is at a sufficient voltage level to cause high temperature electrical arcs to form between the relay contacts. The formation of these arcs is referred to as arcing. Arcing causes contact erosion and reduces the useful service life of the relay.

These arcs may cause pits and welds to accumulate on the contact surface which diminish the useful life of the relay. The pits are formed through a small portion of the contact electrode melting or vaporizing due to the extreme heat of the arc. The extreme heat may also weld the contacts together, thereby making the relay unusable. In addition, these arcs may cause a buildup of carbon deposit on the contacts, which, over time, accumulate to form a high resistance contact between the contacts, thus reducing the current flow to the load and making the relay less efficient.

This contact degradation can often be mitigated by adding a snubber circuit to the contacts to damp this arcing during turn on and turn off of the relay. This solution, depending on the desired load, reactive component of the load, and the voltage, can often become large and costly.

In recent years some attempts have been made to control the physical opening and closing of an electromechanical relay at a point as close as possible to zero voltage in the sine waveform. However, achieving relay closure at the zero-voltage point can be difficult due to the operating nature of a relay. A relay may be defined as an electromechanical switch operated by a flow of electricity in one circuit and controlling the flow of electricity in another circuit. A relay may consist basically of an electromagnet with a soft iron bar, called an armature, held close to it. A movable contact is connected to the armature in such a way that the contact is held in its normal position by a spring. When the electromagnet is energized, it exerts a force on the armature that overcomes the pull of the spring and moves the contact to either complete or break a circuit. When the electromagnet is de-energized, the contact returns to its original position. Variations on this mechanism are possible: some relays have multiple contacts; some are encapsulated; some have built-in circuits that delay contact closure after actuation; some, as in early telephone circuits, advance through a series of positions step by step as they are energized and de-energized.

Since the actuation of a relay requires the physical movement of one of the contact electrodes, there may be some delay from the issuance of a close command until the magnetic field has built to a sufficient level to begin movement of the contact electrodes by overcoming the spring force. This delay makes it difficult to precisely time the actual opening or closing of the electrodes.

Previous circuits have been designed to account for the turn-on time of a relay and switch the relay on near the zero-crossing point. This allows the relay to only be subject to the lowest possible currents (or flyback voltages) possible. One example of such a circuit is in U.S. Pat. No. 4,642,481 issued to Bielinski, et al. Another example is in U.S. Pat. No. 5,267,120 issued to Graff, et al. These prior art circuits, however, are complicated in both structure and number of components making them expensive to use on a mass production scale in highly competitive markets. Additionally, none of the prior art relay control circuits provide different delay times to ensure that relays which have different turn-on and turn-off times are both opened and closed at the zero-crossing circuit.

There are commercial solutions available for this problem called zero cross relays. However, they are typically solid-state device, as this guarantees that the relay switches at the zero cross point in the AC cycle. For this reason, they are typically integrated with the zero cross circuitry, and can be quite expensive as compared to a typical mechanical relay.

There is also the possibility of using a triac or Silicon-Controlled Rectifier (SCR) coupled with a less costly non-integrated zero cross detection circuit. This solution also depends on a costlier solid state switching method, and depending on desired load, could also necessitate the need for heat-sinking for the triac or SCR in order to handle the power (current ^2*resistance or $I^2R$) losses in the device.

SUMMARY OF THE DISCLOSURE

The following presents a simplified summary relating to one or more aspects and/or embodiments disclosed herein. As such, the following summary should not be considered an extensive overview relating to all contemplated aspects and/or embodiments, nor should the following summary be regarded to identify key or critical elements relating to all contemplated aspects and/or embodiments or to delineate the scope associated with any particular aspect and/or embodiment. Accordingly, the following summary has the sole purpose to present certain concepts relating to one or more aspects and/or embodiments relating to the mechanisms disclosed herein in a simplified form to precede the detailed description presented below.

Some embodiments of the disclosure may be characterized as a method of calibrating and operating a relay device for switching AC signals through a load, wherein the method accounts for relay switching delay that changes with relay age and temperature. The method can include measuring relay switching delays for two or more relays at a plurality of temperatures. The method can further include deriving a master polynomial as a best fit to the delays as a function of the temperatures, the master polynomial including variables for temperature, x, and delay, y, and a constant, C, for a y-intercept of the master polynomial. The method can further include coupling a first relay device to a calibration circuit. The method can yet further include measuring a calibration temperature for the first relay device and instructing a relay of the first relay device to switch, and identifying a first time of the instructing. The method can further monitor a signal through the relay to determine a second time when the relay closes. The method can calculate a calibration delay as a time between the second time and the first time (optionally using a timer). The method can include inserting the calibration delay and the calibration temperature into the master polynomial and solving for the constant, C, for the y-intercept to give a use polynomial having the variables, x and y, for temperature and relay delay, respectively. The first relay device can be configured for installation and coupling in series with a load and an AC mains. The first relay device can also be configured for receiving an instruction to switch the relay, measuring a use temperature, and inserting the use temperature into the use polynomial and solving for the delay. The first relay device can also be configured for detecting a first zero crossing of an AC signal from the AC mains passing through the first relay device and determining a frequency of the AC signal. The first relay device can yet further be configured for switching the relay at a subsequent zero crossing minus the delay, the subsequent zero crossing determined based on a time of the first zero crossing and the frequency of the AC signal.

Other embodiments of the disclosure may also be characterized as non-transitory, tangible computer readable storage medium, encoded with processor readable instructions to perform a method for calibrating and operating a relay device for switching AC signals through a load, wherein the method accounts for relay switching delay that changes with relay age and temperature. The method can include measuring relay switching delays for two or more relays at a plurality of temperatures. The method can further include deriving a master polynomial as a best fit to the delays as a function of the temperatures, the master polynomial including variables for temperature, x, and delay, y, and a constant, C, for a y-intercept of the master polynomial. The method can further include coupling a first relay device to a calibration circuit. The method can yet further include measuring a calibration temperature for the first relay device and instructing a relay of the first relay device to switch, and identifying a first time of the instructing. The method can further monitor a signal through the relay to determine a second time when the relay closes. The method can calculate a calibration delay as a time between the second time and the first time (optionally using a timer). The method can include inserting the calibration delay and the calibration temperature into the master polynomial and solving for the constant, C, for the y-intercept to give a use polynomial having the variables, x and y, for temperature and relay delay, respectively. The first relay device can be configured for installation and coupling in series with a load and an AC mains. The first relay device can also be configured for receiving an instruction to switch the relay, measuring a use temperature, and inserting the use temperature into the use polynomial and solving for the delay. The first relay device can also be configured for detecting a first zero crossing of an AC signal from the AC mains passing through the first relay device and determining a frequency of the AC signal. The first relay device can yet further be configured for switching the relay at a subsequent zero crossing minus the delay, the subsequent zero crossing determined based on a time of the first zero crossing and the frequency of the AC signal.

BRIEF DESCRIPTION OF THE DRAWINGS

Various objects and advantages and a more complete understanding of the present disclosure are apparent and more readily appreciated by referring to the following detailed description and to the appended claims when taken in conjunction with the accompanying drawings:

DETAILED DESCRIPTION

Figure 1:
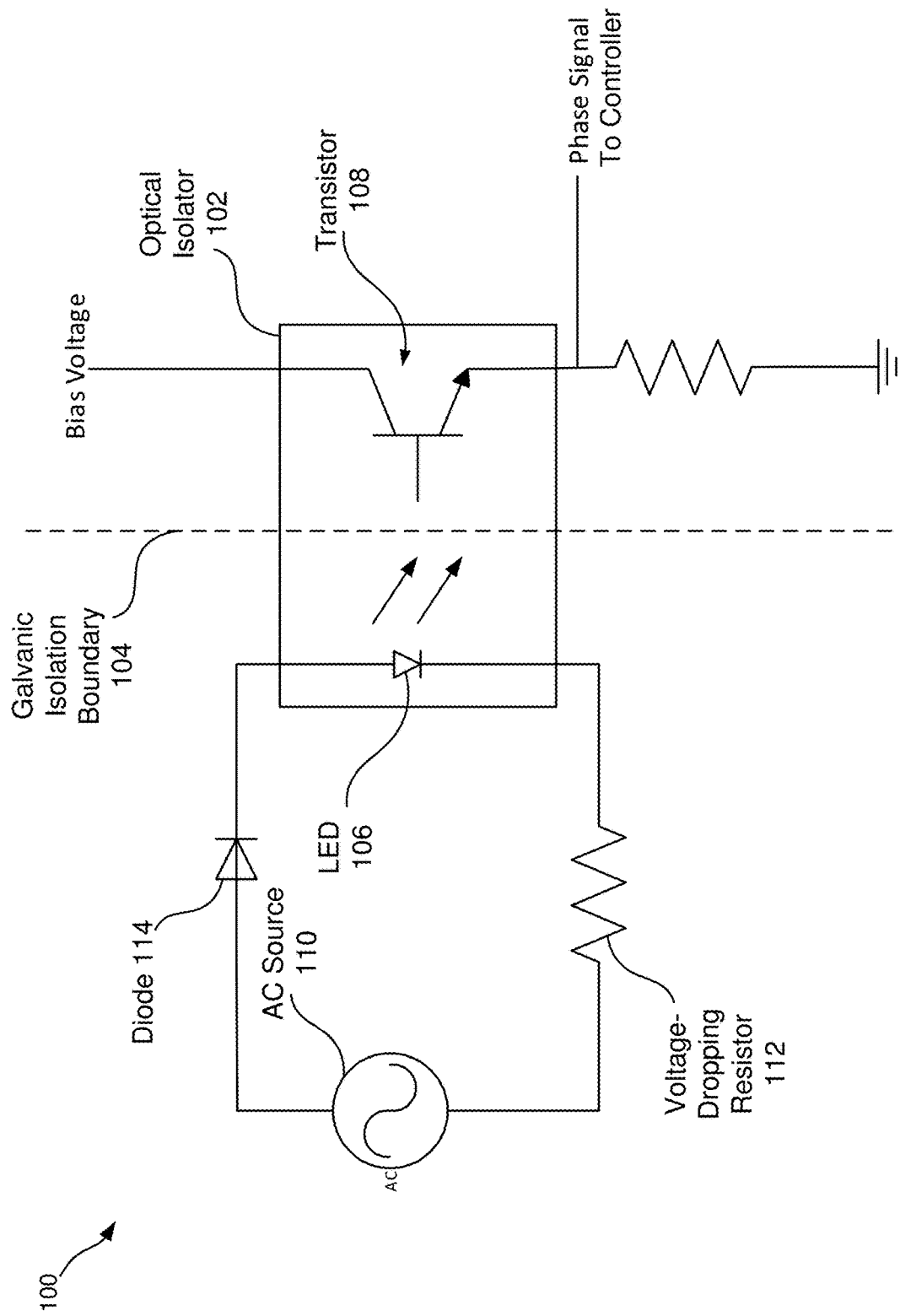
FIG. 1 illustrates a relay device using an optical isolator to provide galvanic isolation between the main circuit and the control circuitry.

The word "exemplary" is used herein to mean "serving as an example, instance, or illustration." Any embodiment described herein as "exemplary" is not necessarily to be construed as preferred or advantageous over other embodiments.

Preliminary note: the flowcharts and block diagrams in the following Figures illustrate the architecture, functionality, and operation of possible implementations of systems, methods, and computer program products according to various embodiments of the present invention. In this regard, some blocks in these flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

Various known methods attempt to switch relays at a zero cross of an AC signal by accounting for relay delay. However, they either fail to account for relay delay, do not detail methods for determining relay delay, hardwire a relay delay into the switching circuit, and generally fail to account for changes in relay delay between relays of the same type, between relays of different type, and for changes in temperature and relay age. Hardwiring the relay delay adds complexity and cost to devices that are already faced with slim profit margins. Thus, there is a need to account for relay delay without added circuitry.

While at least one method is known that attempts to account for relay delay as a function of temperature, this known method looks to relay delay at a previous switching to predict the relay delay at a next switching. However, for lighting and appliance loads, the relay is switched infrequently, sometimes hours or days can pass between switching events. Thus, relying on a temperature of a previous switching has little use or accuracy in lighting of appliance switching applications.

The present disclosure overcomes the limitations of the art in that it switches a relay at or near a zero-crossing based on a delay that accounts for the age and temperature of a relay. Further, the delay relationship to age and temperature is predetermined for each relay. In this way, circuitry of the switching device is simplified, reduced in size, and is less costly. Further, the present disclosure provides for the most accurate temperature-dependent delay determinations yet to date.

In particular, instead of real-time determinations of delay via analogue or digital circuitry, and rather than look to previous in-use switching events to predict future switching delays, this disclosure describes systems and methods for generating a model or polynomial to describe a relay delay as a function of temperature for each relay. The model of polynomial can be derived via calibration before the relay device is put into use (e.g., at a factory or calibration facility). Hundreds or thousands of relay devices can be calibrated in this way using one or a handful of calibration circuits. Said another way, the present disclosure relates to (1) characterizing a relay delay, (2) detecting zero crossings of an AC signal, and (3) triggering the relay switching at a time offset from a subsequent zero crossing minus the delay.

Before calibration, a plurality of relay devices of the same type can measure their own relay delay, or can do so via coupling to a calibration circuit, for a plurality of temperatures. Although the circuitry and logic for making these measurements can be included on the relay devices, reductions in cost can be achieved by housing most or all this logic/circuitry on the calibration circuit, and then moving the calibration circuit between the plurality of relay devices. The result can be a plot of relay delay as a function of temperature for a plurality of relay devices (for instance, see FIG. 11). An average of these data sets can be derived as a model or polynomial for the type of relay device (see "Averaged polynomial" in FIG. 11). The model or polynomial can include variables for relay delay and temperature and can include a y-intercept that is unique to each relay device, but is not yet known.

The next step is to determine the y-intercept of the model or polynomial for each relay device. Each relay device can include a calibration input and output channel and these channels can be coupled to a corresponding input and output of a calibration circuit. The calibration circuit or the relay device can have an unsolved model or polynomial thereon, and once the calibration circuit is coupled to the relay device, the relay device can measure an ambient temperature via a temperature sensor. The measured temperature can be plugged into the unsolved model or polynomial at the temperature variable, and the resulting relay delay can be plugged in for the relay delay variable. The result is a solution for the y-intercept for the relay device being calibrated. In this way, a y-intercept, and thus a unique model or polynomial, for each relay device is generated. These unique models or polynomials can be stored on the respective relay devices.

The relay devices can then be installed in an AC circuit between an AC power source and a load. The relay devices can receive switching indications (e.g., a user flipping a mechanical switch of a light switch for a room) and can then switch the relay in response. The timing of this switching can be adjusted to coincide with a zero crossing of the AC signal from the AC power source without being noticed by a user (a few cycles of 60 Hz being much faster than is humanly-recognizable). To determine precisely when such switching of the relay should occur after each switching indication is received, a current temperature can be measured or accessed from memory, plugged into the unique model or polynomial in a memory of the relay device, and the model or polynomial can be solved to give an estimated relay delay. The relay trigger can then activate by this value prior to a next zero crossing of the AC signal (i.e., switching the relay at a subsequent zero crossing minus the estimated relay delay).

While calibrating a relay device for relay delay that changes as a function of temperature and age seems to be a step backwards from the various and complex real-time delay determination circuits, calibration enables existing relay devices to account for relay delay to sufficient accuracy without the need to add circuitry to relay devices. Instead, each relay device can be coupled to a calibration circuit and can be loaded with a model or polynomial representing the temperature relationship of the given relay to relay delay. During operation of the relay device, temperature can be monitored, and this temperature plugged into the model or polynomial to determine an estimated relay delay.

Characterizing Relay Delay

Figure 3:
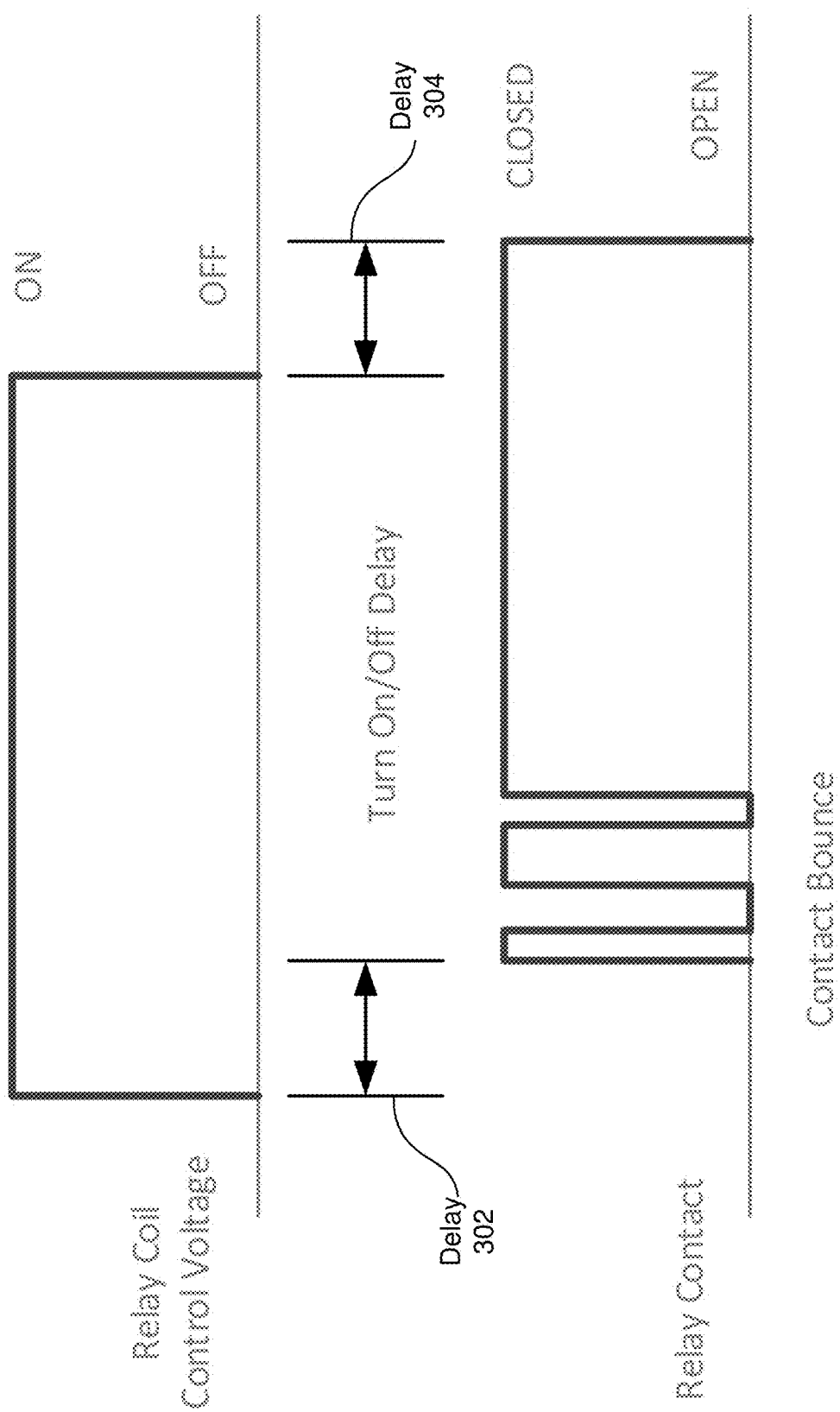
FIG. 3 illustrates a sample relay coil control voltage waveform (top) and a corresponding relay contact state (bottom)

As previously mentioned, most mechanical relays have an inherent delay from the time the control voltage is supplied to the control coil to the time that the contacts close. This is primarily due to the time it takes for a magnetic field in the control coil to build up. Conversely, when the voltage is removed from the coil, there is a delay until the magnetic field collapses enough to release the contacts. An example of this delay is shown in FIG. 3 where a delay 302 between relay coil control voltage turn on and relay contact closing. Similarly, there is a delay 304 between when the relay coil control voltage turns off and when the relay contact opens. There is also "contact bounce" at the start of the relay switching that shows that the relay experiences some vibration or bouncing at a start of each closing event such that current passage through the relay flutters for a time during initial switching.

The delays 302, 304 may vary from relay to relay, and can differ over time (i.e., aging) and ambient temperature. To account for these variations, n samples of the delay can be measured at different temperatures to get a statistical representation of the delay (Block 1102 in FIG. 11). FIG. 12 shows a plot of such sampling for an exemplary, but non-limiting, set of relays. As the number of samples increases, the accuracy of characterizing the delay as a function of time and temperature increases.

In an embodiment, the delay can be measured during processing and used to calibrate future delays during a same processing run. In another embodiment, a bias can be applied to one side of the relay contacts, the relay can be switched, and a time between application of the control voltage for switching and detection of the bias voltage on the other side of the relay contacts can be measured. This delay can be measured under different temperature conditions as well as between processing runs to re-calibrate the delay as the contacts age. For instance, an algorithm relating temperature, current at the time of switching, number of switching cycles, etc. can be developed to relate these variables to a predicted age of the contacts. Additionally, given a high enough sampling rate, a bouncing of the relay can also be characterized (bouncing can be seen at the start of the lower trace in FIG. 3).

Given this data set, a master polynomial can be generated as a best fit to the data charting delay as a function of temperature and relay (i.e., a different set of data for each relay) (Block 1104). For instance, in the example of FIG. 11, the master polynomial is:

$$y=0.0882x^2+4.524x+4372.2$$

Where y is the relay turn on delay and x is the temperature. The value 4372.2 represents a y-intercept of the polynomial. Thus, adjusting or solving the y-intercept value for different relays can provide a polynomial fitted to a given relay. Written more generally, the master polynomial can be written as:

$$y=Ax^2+Bx+C$$

Where A and B are constants determined from fitting the polynomial to the data charting delay as a function of temperature and relay, and C is the y-intercept for that fitting.

To determine the y-intercept for each relay, a temperature, y, and delay, x, are measured for each relay and these values are substituted into the master polynomial and solved for the y-intercept C to give a use polynomial for each relay:

$$y=Ax^2+Bx+C$$

Higher or lower order polynomials may also be used in some circumstances. Deriving the use polynomial can be performed on the relay device itself, although to reduce on-device circuitry and cost, a calibration circuit such as 510 in FIG. 5 may be used.

Figure 5:
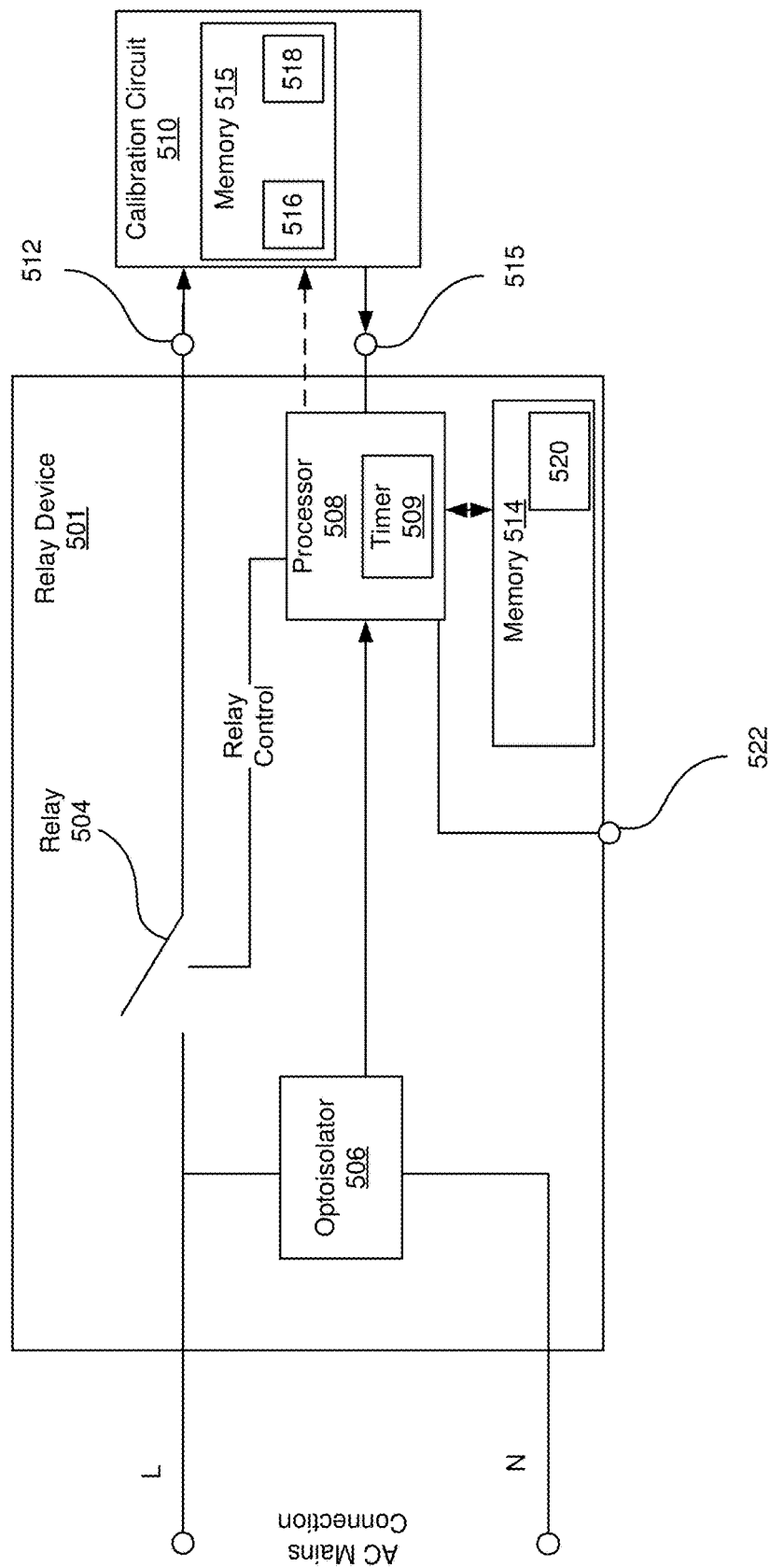
FIG. 5 illustrates an embodiment of a relay device coupled to a calibration circuit.

FIG. 5 illustrates an embodiment of a relay device coupled to a calibration circuit. This coupling can occur during a calibration phase used to determine a use polynomial for each relay device. Once the master polynomial is determined, a relay device 501 can be coupled to a calibration circuit 510 (Block 1106). The relay device 501 includes an AC mains input that may include positive and negative power connections (L and N). The relay device 501 may include a relay 504 in series with an output 512 and controlled via a relay control by a processor 508. An optical isolator 506 can be arranged between the AC mains connections, and the optical isolator 506 can include an output to the processor 508. The processor 508 may also have a connection to a temperature sensor 522, so that the relay device 501 can determine a calibration temperature (Block 1108). The processor 508 can store data to a memory 514 (e.g., ROM encoded with firmware) and retrieve data from the memory 514. Lastly, the relay device 501 can include a connection to a calibration circuit 510, the connection including an output 512 and an input 515. Optionally, the processor 508 may have a connection to the calibration circuit 510. The output 512 can provide a voltage, current, or both from an output of the relay 502. Thus, when the relay 504 is closed, power from the AC mains connection passes to the calibration circuit 510 and can be read as an indicator that the relay 504 has closed. The input 515 may provide a use polynomial 518 to the processor 508 or can provide an isolated relay closure/detection signal that the processor 508 can use to determine the use polynomial 520.

More specifically, the calibration circuit 510 can include a memory 514 having the master polynomial 516 stored thereon. The calibration circuit 610 can be coupled, one-by-one, to each of a plurality of relay devices 501, and for each, the processor 508 can send a relay control signal to the relay 504 to close, and record a time of this signal (Block 1110). The optosiolator 506 can provide a signal to the processor 508 that indicates whether the relay 504 is open or closed (Block 1112). The processor 508 can record a time when a signal is received from the optosiolator 506 indicating that the relay 504 is closed. The two recorded times can give a calibration delay (Block 1114). Alternatively, the processor 508 can instruct the relay 504 to close, and start a timer 509. When the relay 504 closes, the AC mains can provide power to the calibration circuit 510, that then passes an isolated signal back to the processor 508. When the processor 508 sees this signal it can stop the timer 509, and this timer 509 value can equal to relay 504 delay. However, the relay 504 delay is measured, the relay 504 delay can then be stored in the memory 514. The processor 508 may then pass the temperature and the relay 504 delay to the calibration circuit 510. The calibration circuit 510 can access the master polynomial 516, plug these values into the master polynomial 516, and solve for the y-intercept to give a use polynomial 518 unique to the relay device 501 (Block 1116). The calibration circuit 510 can then pass the use polynomial 518 back to the processor 508 for storage as 520 in the memory 514. This same process can be repeated for all relay devices 501 during a calibration phase (e.g., at the factory or anytime before the relay devices 501 are installed for use) such that each relay device 501 includes a version of the master polynomial 516 tailored to that relay device 501 (i.e., the use polynomial 518, 520).

Although not shown, in some cases the processor 508 may instruct the relay 504 to close, and send an indication of the time of this instruction to the calibration circuit 510 along with a temperature reading from the temperature sensor 522. When the relay 504 closes, the calibration circuit 510 may receive a voltage or current signal via the output 512 and can, via its own timer, calculate a delay from the trigger time indicated by the processor 508. In this way, the calibration circuit 510 has access to a relay delay, temperature, and the master polynomial 516, and can solve for the use polynomial 518.

Alternatively, the processor 508 can record a temperature from the temperature sensor 522, instruct the relay 504 to close and record a first time of this instruction. When the relay 504 closes, a signal will be able to pass through the output 512 to the calibration circuit 510. The calibration circuit 510 may pass this signal through isolation circuitry and then return the isolated signal to the processor 508. The processor 508 can then use this signal, and/or a timing of this isolated signal (a second time), to determine a calibration delay (e.g., the time elapsed between the first and second time). The processor 508 can then use the temperature and this calibration delay to solve the master polynomial for the y-intercept, C, thus giving a use polynomial 520 that is stored in memory 514 and then used when the relay device 501 is installed and used to switch a load (e.g., an LED, multiple LEDs, or an appliance, to name a few).

Alternative: Double Pole Relay

It is also possible to utilize a double pole relay to provide real-time data on the mechanical delay of the relay over and above the initial characterization described above. In this embodiment, the relay can include a second set of contacts, and these can be dedicated for providing feedback of the delay at each switching event to the controller. This information could be used in conjunction with the characterization of the delay described above to even more accurately predict when the relay is to be switched.

Figure 13:
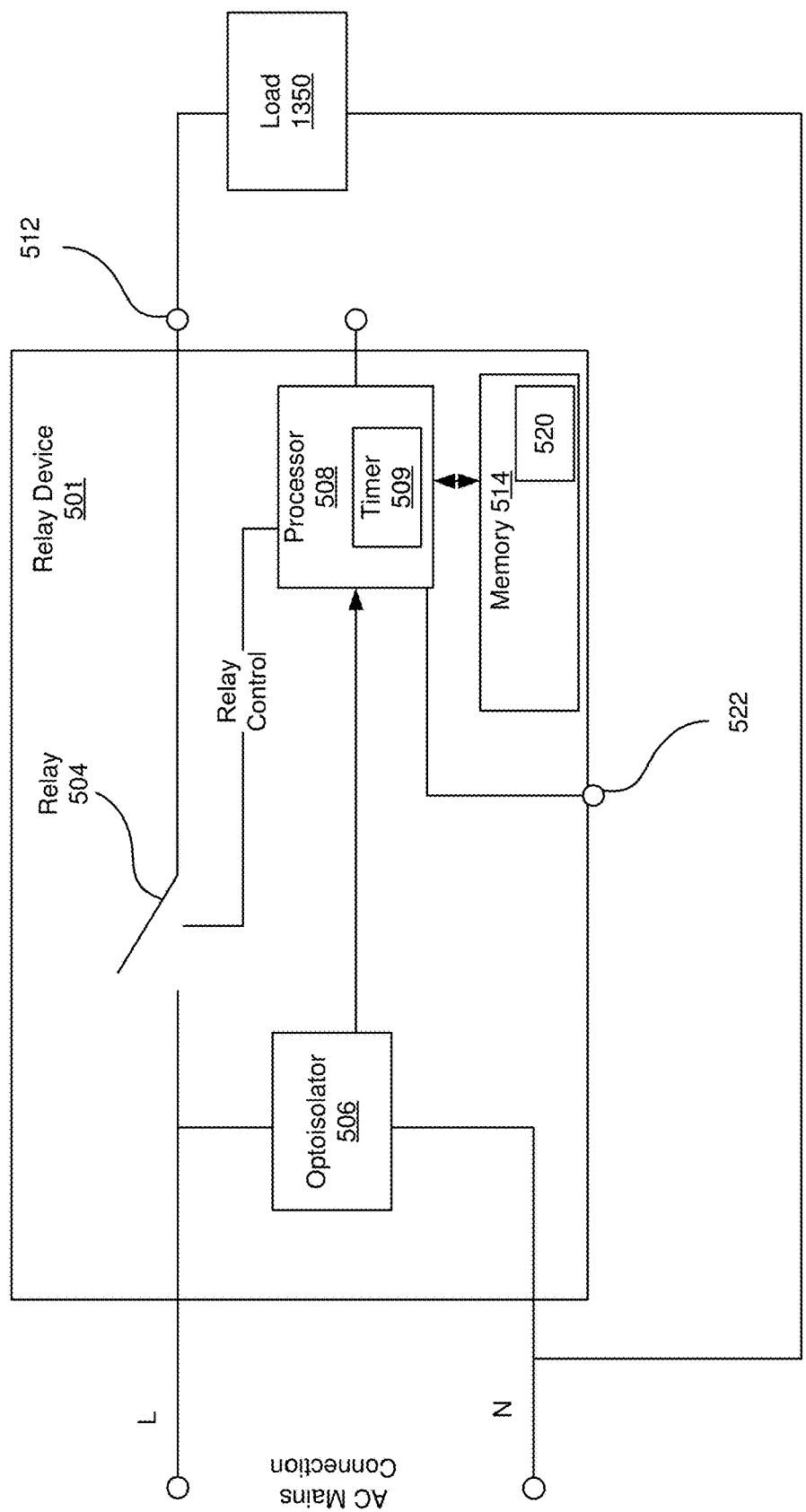
FIG. 13 illustrates the embodiment of the relay device of FIG. 5, but coupled to a load rather than the calibration circuit.

FIG. 13 illustrates the embodiment of the relay device of FIG. 5, but coupled to a load rather than the calibration circuit. Once the use polynomial 520 is stored in the memory 514, the relay device 501 can be installed and coupled to a load 1350. The load 1350 can include an LED driver, a group of LED drivers, or an appliance, to name a few non-limiting examples. The relay device 501 can receive an indication from an external source that power to the load 1350 is to be switched (Block 1122). A zero cross may be known (Block 1124) via analysis of the signals coming from the optical isolator 506, and the processor 508 may characterize the frequency of the AC signal (Block 1126). A temperature can be taken (Block 1118) and these values can be inserted into the use polynomial 520 to determine the relay delay, y, for the relay 504 (Block 1120). Given the AC frequency and the delay, a time to instruct the relay 504 to switch can be ascertained, and the processor 508 can use this time to switch the relay 504. In this way, power is switched to the load 1350 with a delay that allows the relay 504 to completed switching at or just before a zero cross.

Figure 11:
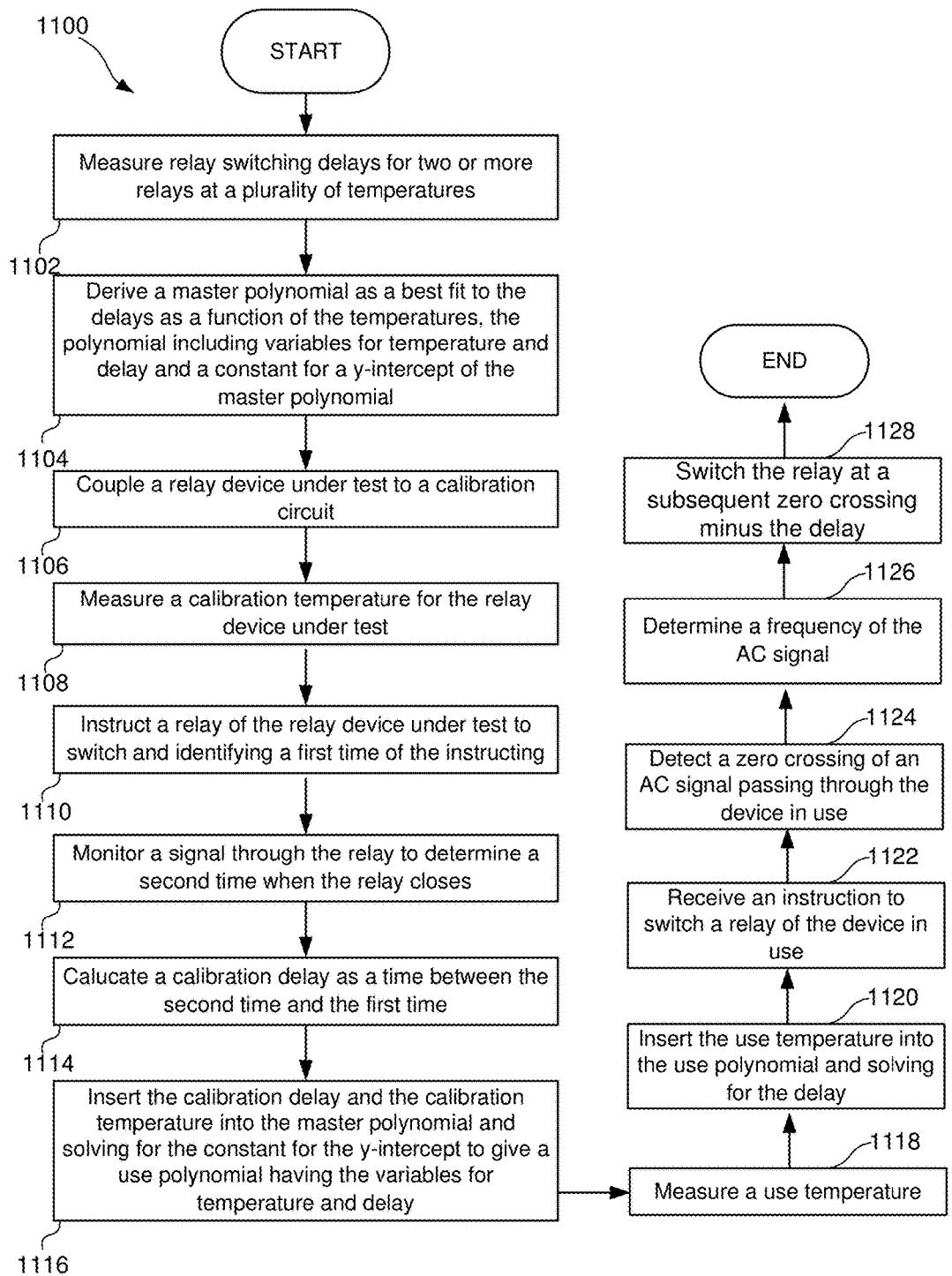
FIG. 11 illustrates a method of calibrating and operating a relay device for switching AC signals through a load, wherein the method accounts for relay switching delay that changes with relay age and temperature.
Figure 12:
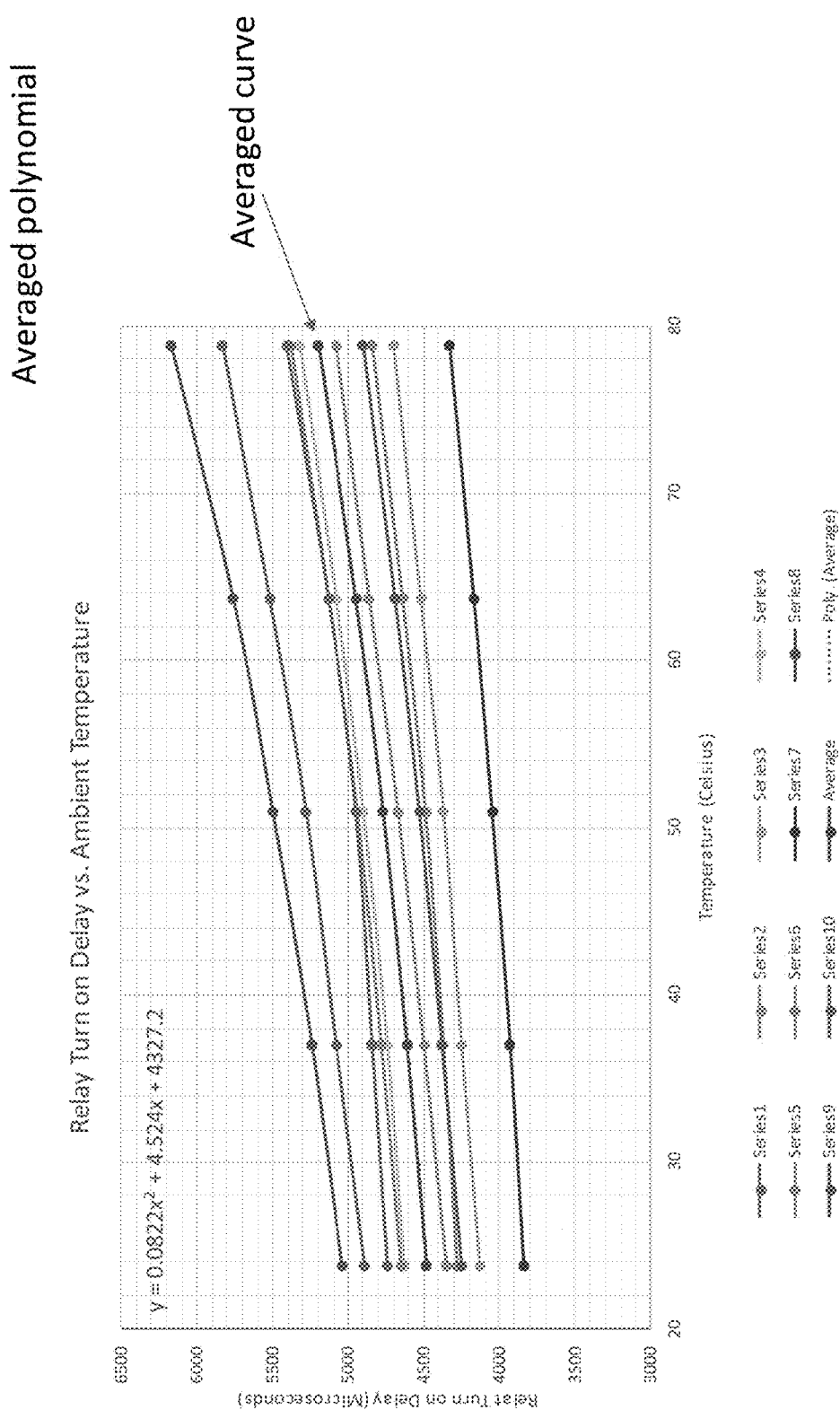
FIG. 12 illustrates a plot of exemplary temperature versus relay delay for eight different relays of the same type and a curve plotting an average polynomial fitted to the other eight curves.

Although FIG. 11 shows a specific order of the operations 1118, 1120, 1122, 1124, and 1126, those of ordinary skill in the art will appreciate that the order of these operations can be varied. For instance, receiving the instruction 1122 may occur first. In other instances, the frequency, temperature, and zero crossings may be determined on a periodic basis, such that they are all known when a switching instruction arrives. In other cases, some of this monitoring may occur before a switching instruction and some may occur after the switching instruction is received. In some cases, solving the use polynomial (Block 1120) may occur after the switching instruction is received (Block 1122).

The temperature sensor 522 can take periodic temperature measurements and pass these to the processor 508 (Block 1118). Alternatively, the processor can request a temperature reading when an instruction is received to switch the relay 504 (Block 1118). Alternatively, the processor can receive periodic temperature readings from the temperature sensor 522, but only record those readings proximal to a time when an instruction to switch the relay 504 is received, or after an instruction to switch the relay 504 is received (Block 1118). However, the temperature is acquired it can be referred to as a use temperature. Although not shown, the processor 508 can include an input that a use or other source uses to indicate to the relay device 501 that switching the load 502 is desired. For instance, the processor 508 may include an input from a mechanical light switch, other mechanical power switch, or a touch-based power switch.

Often, the AC signal is galvanically isolated from the mains circuit. Galvanic isolation is a principle of isolating functional sections of electrical systems to prevent current flow (e.g., no direct conduction path is permitted). Therefore, some means is preferred for providing a signal across a galvanic isolation boundary without making a direct current or direct electrical connection across the boundary. An optical isolator 506 (or zero cross detector), is one non-limiting example of a device that can pass signals across the galvanic isolation boundary without shorting both sides of the boundary. A more detailed view of the optical isolator 506 and its operation is provided in FIG. 1.

FIG. 1 illustrates a relay device using an optical isolator to provide galvanic isolation between the main circuit and the control circuitry. Current through an LED 106 of the optical isolator 102 is related to a sinking current through a transistor 108 in the optical isolator 102, and this relationship can be used to convert a current at the emitter of the transistor 108 to the current in the LED 106 (i.e., the current of the AC input waveform). The use of optical transmission enables data to traverse the galvanic isolation boundary 104 without shorting the two sides.

The transistor emitter output (or phase signal) provides a representation of the input AC waveform at LED 106 that can be interpreted by a controller or processor, such as processor 508 in FIG. 5. In an embodiment, an analogue to digital converter can sample the analogue output of the optical isolator 102, and the digital signal from the converter can be provided to a controller that determines the zero crossing from the digital signal. Sample waveforms measured at the output to the controller or processor are shown in FIG. 2.

Figure 2:
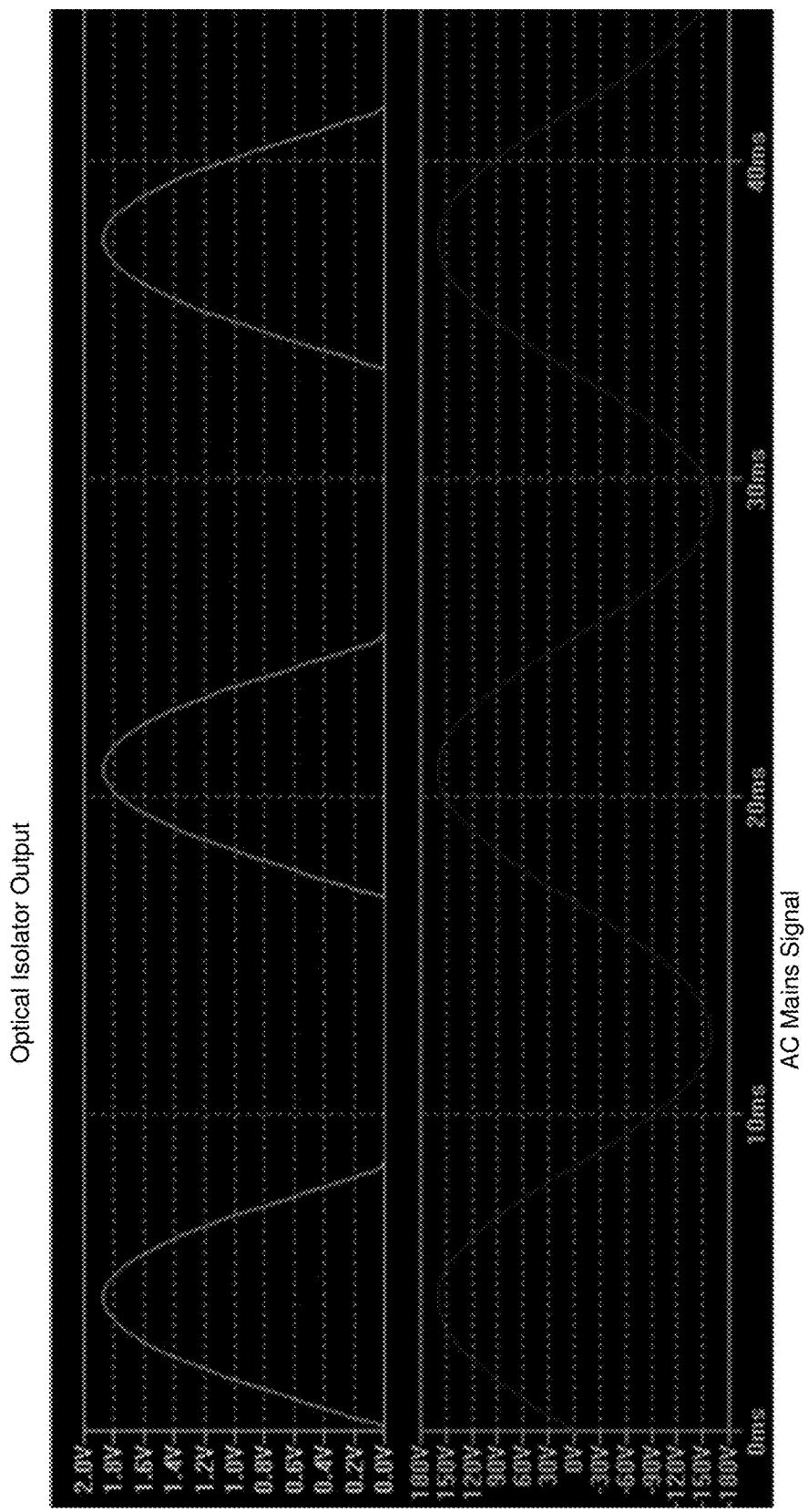
FIG. 2 illustrates sample waveforms measured at the output to a controller or processor (top) as well as the AC input signal (bottom)

At the bottom of FIG. 2 is an exemplary trace showing the AC input signal (bottom) generated by an AC source such as AC source 110 or the AC mains of FIG. 5. This signal generates light through the LED 106 when the AC signal is positive, and little to no light output when the AC signal is negative. In other words, the LED 106 of the optical isolator 102 rectifies the AC signal. The top trace (top) shows this rectified signal as measured at an output of the optical isolator 102 (i.e., an output of the transistor 108). In other words, this rectified signal can be passed to the controller or processor to provide an indication as to when a zero cross has occurred.

As shown, the logic signal, or output of the optical isolator 102, falls to zero at the zero cross, or zero crossing, of the AC signal. At this zero cross, the current through the AC circuit is near zero. The output of the optical isolator 102 can be provided to an A/D converter and the digital output therein provided to a controller or processor, or the output can be provided to an input of a comparator with the other input biased to or near 0V. In this way, the controller/ processor or the output of the comparator can indicate zero crossings.

One of skill in the art will recognize that use of an optical isolator is only one of many ways that can used to detect the zero crossing in a galvanically-isolated electrical system.

Given a timing of a last zero crossing, the processor 508 can seek to determine a time of a next zero crossing. One way to do this is to measure a frequency of the AC signal and use this to predict a next zero crossing based on the last detected zero crossing (Block 1126). The frequency can be measured in response to the receiving of an instruction to switch (Block 1122) or can be periodically measured, thus establishing a frequency before the instruction is received (Block 1122).

Various devices can be used to determine a frequency and thereby a period of the AC signal (e.g., a phase detection circuit or any circuit configured to measure a phase of the AC signal). For example, at 60 Hz, the time between zero cross events, or the period, is 8.33 mS (one half of a full period of a 60 Hz signal). In an embodiment, a maximum and minimum of the AC waveform can be measured or calculated and a period of the AC waveform determined as the inverse thereof. In one embodiment, an analog-to-digital sampling method can be used relative to an output of the optical isolator to perform an analogue measurement of the AC waveform, and the frequency can be determined therefrom. In other embodiments, the frequency may be provided by the AC source and thus need not be measured.

Given the AC frequency and a known last zero crossing, a next zero crossing can be extrapolated. Given the use temperature (Block 1118) and knowledge of a next zero crossing (Block 1124 and 1126), the processor 508 may insert the use temperature into the use polynomial and solve for the relay delay (Block 1120). This relay delay can be subtracted from a predicted time of the next zero cross to provide a timing for instructing the relay 504 to switch (Block 1128). Some examples of determining a time for the switching instruction to be sent (Block 1128) are detailed below.

Method I:

The processor 508 can determine a trigger time for sending a control signal to the relay 504 such that the relay 504 will switch at the zero crossing. The processor 508 can look at a digital representation of an output of the optical isolator 506 as generated by an analogue-to-digital converter sampling the output of the optical isolator 506. The processor 508 can then subtract the relay delay from the determined period of the AC signal to find a time after a previous zero crossing, or before a next zero crossing, when the next control signal is to be sent to the relay 504 (or the relay coil). In other words, the control voltage can be sent at the following trigger time:

$$1/f-\text{delay}(T,\text{age})=\text{trigger time}$$

Where f is the frequency of the AC signal and delay(T, age) is the relay delay pre-calculated via the use polynomial and based on temperature, T, and optionally an age or the relay 504.

As an example, if the mechanical delay of the relay 504 for a given temperature and age is found to be 2.33 ms, and the AC signal has a 60 Hz frequency, then the difference between the period of the AC signal, 8.33 ms, and the relay delay, 2.33 ms, is 6 ms (8.33 ms-2.33 ms). This trigger time can then be used to trigger a next switching of the relay 504. For instance, given the value 6 ms as calculated above, the processor 508 can send the activation/deactivation signal 6 ms after a last zero cross, which, given the relay delay, will lead to closing/opening of the relay 504 at the next zero crossing.

This method can also be useful to determine the input voltage of the relay device 501 and/or load 502 based on the peak voltage measured by the A/D sampling of the optical isolator 506 output. This can be useful, for instance, to detect irregularities, surges, etc. on the line voltage.

Method II:

Utilizing a comparator (e.g., part of the processor 508), a phase signal from the optical isolator 506 can be fed into an input of the comparator. Meanwhile the other input of the comparator can be biased to zero volts or near zero volts (to avoid any noise floor). This will allow the output of the comparator to indicate whether the input from the optical isolator 506 is above or below the bias input. The processor 508 can then trigger on this transition point as a zero-cross event. The same method can be used to apply the appropriate delay to switch the relay 504.

Whether Method I or II is implemented, it is important to note that it may not be imperative to switch the relay 504 exactly at the zero cross to gain the benefits of zero-cross switching. The main objective is to severely reduce the current flowing through the relay 504 contacts during switching. This will result in less contact damage and subsequently better reliability. Accordingly, it may be advantageous to switch the relay 504 slightly before the zero cross. Said another way, the processor 508 can send a relay control signal at a time slightly before a relay delay period before the next zero cross.

Methods I and II Combined

A combination of Methods I and II can also be used to achieve a good mix of phase signal information and a fast identification of zero crossing events. Integrating all characterizations may provide the most accurate predictive delay for zero cross switching. For example: the delay may be characterized in that the initial mechanical delay is found to be 2 ms, and that the delay increases 0.1 ms for every 10 C° of temperature rise over the characterization temperature, and that the delay increases to 0.2 ms after 10,000 operations. Given this information, if the temperature rise was 20 C°, the relay was at its 20,000$^{th}$ operation, and the AC mains frequency is 60 Hz, the relay delay would be 8.33 ms–(2.4 ms+0.2 ms).

In some embodiments, the relay switching instruction may be sent slightly before a time expected to cause a perfect zero cross switching event. This is because, as the AC sinusoidal signal approaches a zero cross, the signal is decreasing in magnitude. Switching slightly before the zero cross does not lead to much current passing through the circuit and thus achieve the same goal as a perfect zero cross. However, and recognizing that achieving a switching event precisely when desired is difficult if not impossible (i.e., there is some variance between each switching event), and that a switching event takes a finite amount of time, switching slightly early means that if the actual event occurs slightly before or after the targeted switching time, the AC signal will still be decreasing, and thus any variance of finite elapsing of the switching event, still occurs during a decreasing portion of the signal. However, were the switching event aimed precisely at the zero cross, and the event occurred slightly after the zero cross, or its finite period stretched slightly past the zero cross, then the switching could see an increasing magnitude of the current, even if just briefly. This increasing period is far more likely to cause arcing and thus defeat the purpose of zero-crossing attempts. For this reason, it may be beneficial to target a time slightly before the zero cross for the switching to occur.

Although not shown, the relay device 501 can include a radio configured to receive switching instructions from another device. In another embodiment, the relay device 501 can include a 0-10V or other type of dimming controller configured to receive a dimming signal and control a current provided to the load 502. The relay device 501 may include circuitry for measuring power consumption by the load 502.

Figure 6:
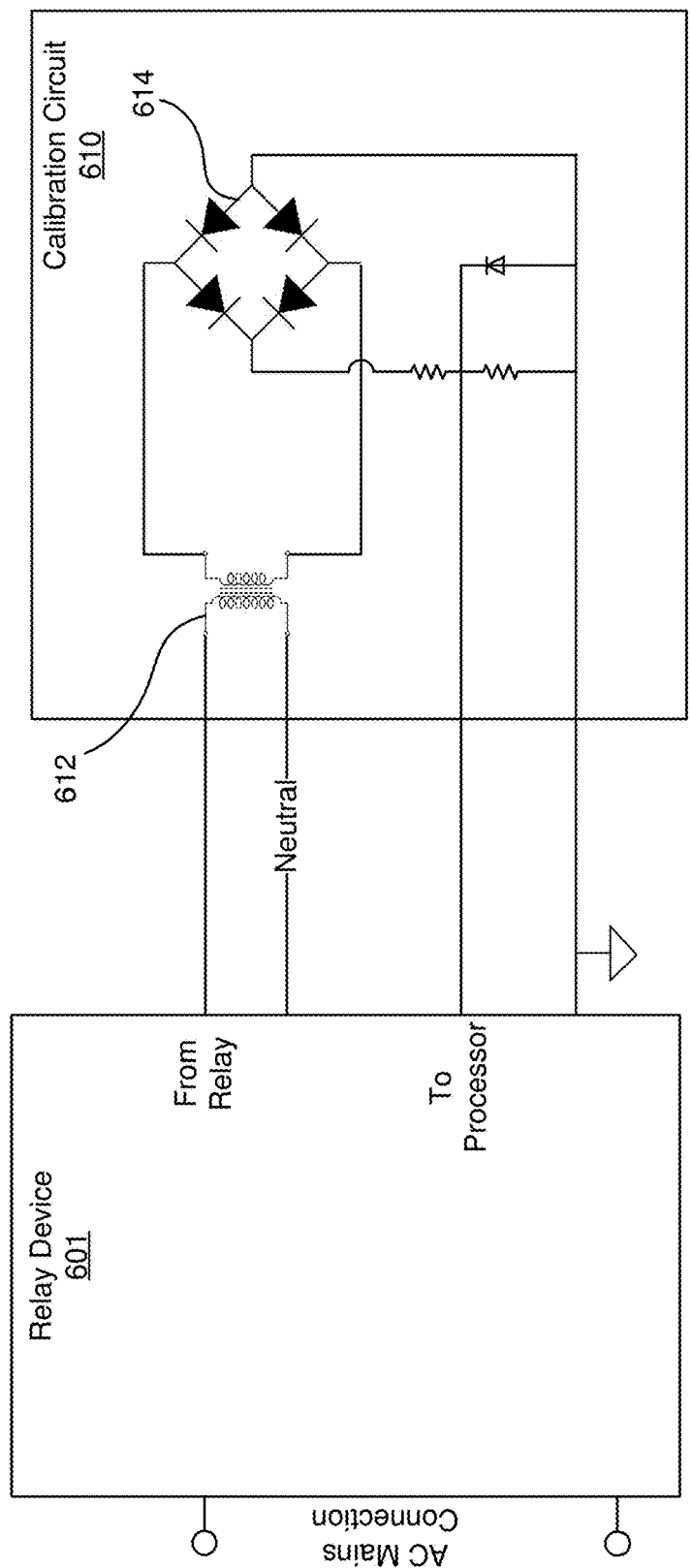
FIG. 6 illustrates details of one embodiment of a calibration circuit.

FIG. 6 illustrates details of one embodiment of a calibration circuit. The relay device 601 can include two channels between it and the calibration circuit 610. Each channel can include a high/load and neutral line. One channel can couple the relay output to the calibration circuit 610 and the other channel can be coupled the processor to an output of the calibration circuit 610. The input channel to the calibration circuit 610 may be galvanically isolated from the AC mains side of the system, for instance via a transformer 612. The transformer can be coupled to inputs of a full-wave rectifier 614, for instance, comprising four diodes. The full-wave rectifier 614 can have outputs coupled to the output channel, providing rectified signals to the processor (not shown) so that the processor can determine a relay delay.

Alternative Topology 1 for Zero Cross Identification

It is difficult to both meet EnergyStar power requirements and sense the zero cross of the line in a cost-effective manner. Usually the designer will use a high-cost power line monitoring integrated circuit chip or some sort of analog topology to constantly drive an optical isolator. This causes power consumption by a transistor of the optical isolator throughout at least half of the line cycle. Thus, known solutions are costly and power hungry. Zero-cross detection is important to synchronize events with the line phase. Examples of synchronization are relay open/closing events, phase dimming, time keeping, microprocessor oscillator calibration, radio communication synchronization, etc.

Figure 7:
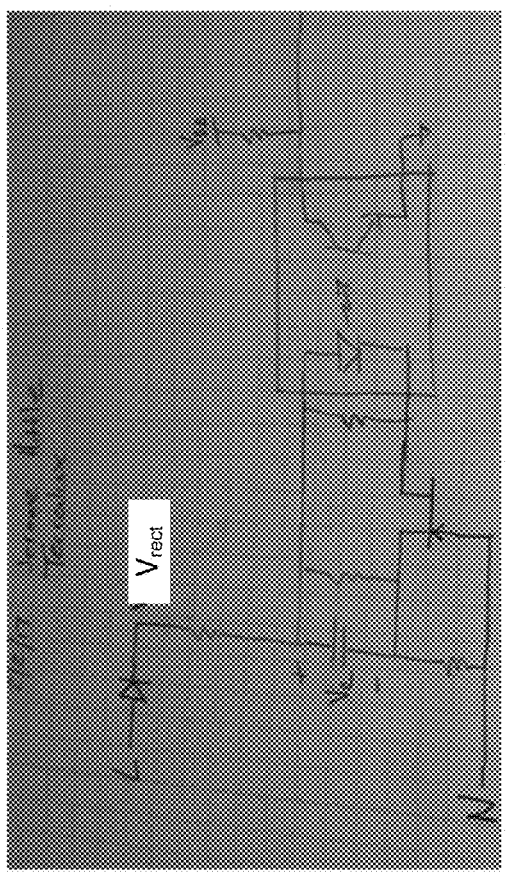
FIG. 7 illustrates an alternative zero-cross detection circuit topology.
Figure 9:
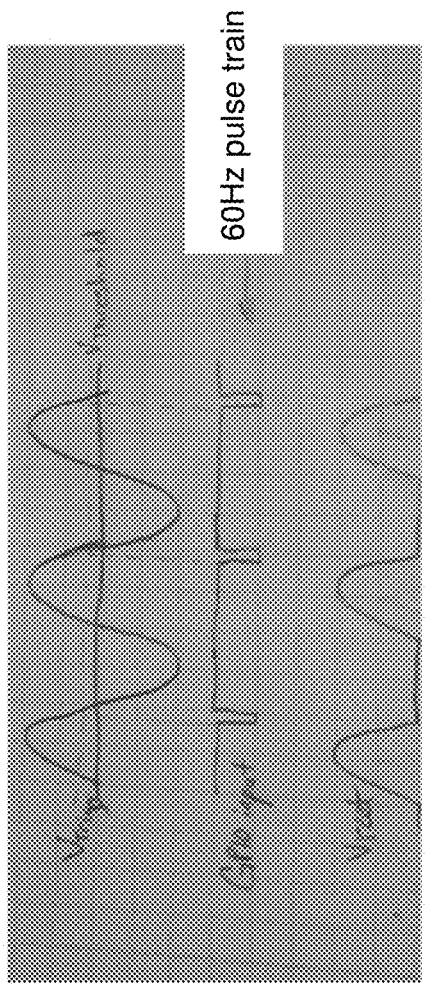
FIG. 9 illustrates waveforms corresponding to FIG. 7.

To overcome these challenges, one embodiment seeks to reduce an amount of time per cycle that a transistor of an optical isolator is in operation, thereby reducing power consumption needed for zero-cross identification. Specifically, a zero-cross circuit topology is disclosed as seen in FIG. 7 where the transistor of the optical isolator is only turned on during a short portion of the AC cycle—a time during which the voltage is positive, but below a threshold (see FIG. 9A). One topology can include a small-value capacitor 702 arranged in series with the load 704 and the AC mains. The small-value capacitor 702 can also be in series with a diode 706. In an embodiment, the diode 704 can be selected so that the capacitor 702 is charged through approximately 150 degrees of the line cycle. The small-value capacitor 702 can be arranged in parallel to a LED 708 of an optosiolator 710. A switch 712 (e.g., a transistor) can be arranged between an anode of the small-value capacitor 702 and the cathode of the LED 708, the switching of this switch 712 controlling whether current can pass through the LED 708. The diode 706 rectifies the AC signal meaning that the capacitor 702 is charging during positive halves of the AC cycle. When the positive half of the AC signal drops below the threshold voltage, the AC mains is effectively disconnected from the capacitor 702. This voltage threshold is a function of a gate-source cutoff voltage for a transistor 712. This can vary significantly from part to part so there are some errors introduced from this and the line voltage used. These can be reduced with production line measurements and calibration or careful selection of the transistor 712. A control or gate of the transistor 712 is coupled through a resistor or other resistive element to the anode of the capacitor 702. When the AC mains signal drops below the voltage threshold, the control or gate of the transistor 712 is turned on or forward biased, and the transistor 712 closes. Until this point, the transistor 712 has been closed, and thus no current is able to pass through the LED 708 (as seen by the high output of the transistor 714 of the optical isolator 710 in FIG. 9B). With the closing of the transistor 712 the charge on the capacitor 702 starts to discharge through the LED 708 and through the transistor 712, which drives the transistor 714 output low as seen in FIG. 9B for portions of the AC line cycle in FIG. 9A that are positive yet lower than the threshold. The capacitor 702 value is selected so that when the transistor 712 is on, the capacitor 702 quickly discharges through the LED 708 of the optoisoater 710. This leads to a sharp pulse at an output of the optical isolator 710 at or starting just before the zero cross. The smaller the capacitor 702 value, the sharper this pulse. Because the phase angle does not change on each repetition of the line cycle, a time delay of the zero cross can be calculated via the processor 508 (either through production testing or mathematical calculation) to determine the exact zero cross of the signal. The zero cross can then be used to synchronize different line dependent sequences including, phase dimming, relay actuation, etc.

In addition to zero-cross, line voltage levels can be detected because the amount of energy stored in the capacitor 702 is different at different voltage levels. So, when the capacitor 702 is discharged, the pulse-width of the pulse is longer at higher line voltages.

Alternative Topology 2 for Zero Cross Identification

Figure 8:
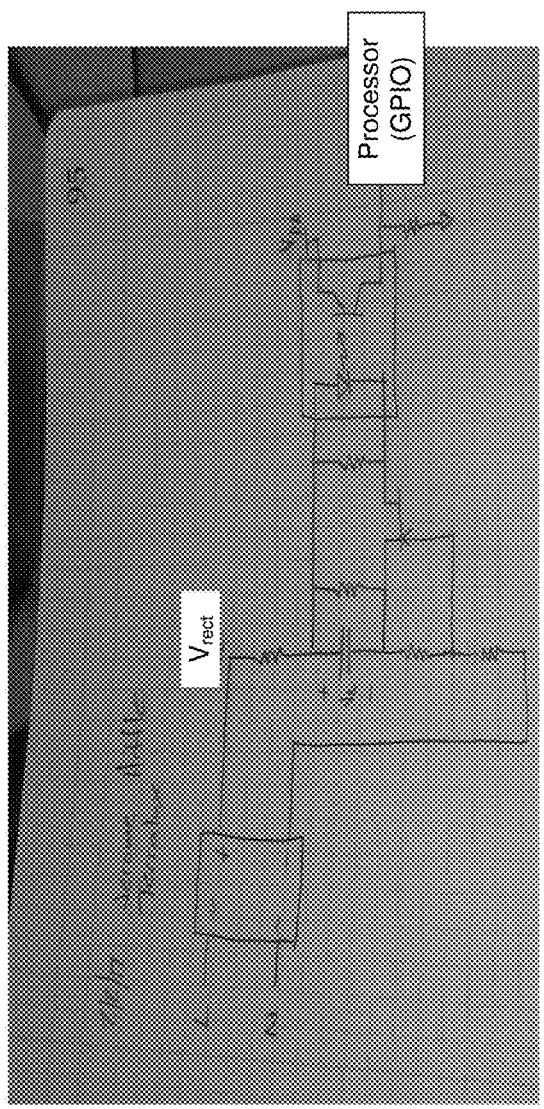
FIG. 8 illustrates another alternative zero-cross detection circuit topology.
Figure 10:
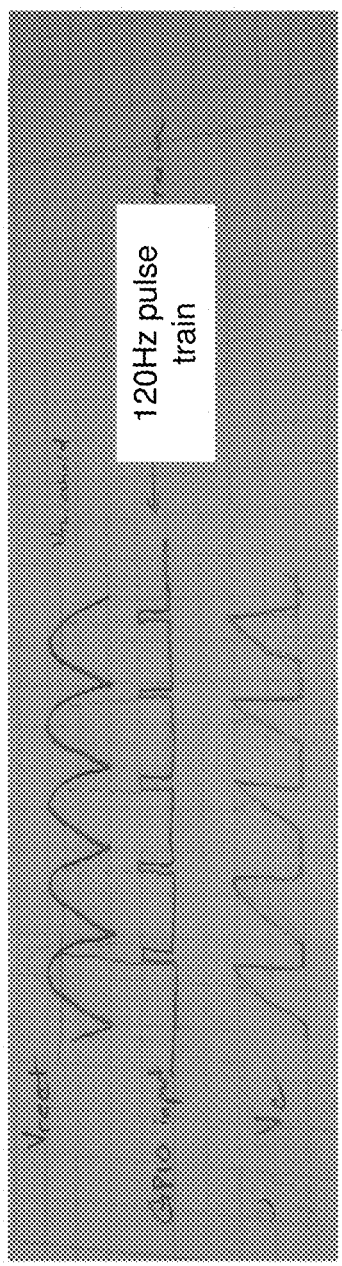
FIG. 10 illustrates waveforms corresponding to FIG. 8.

FIG. 8 illustrates another zero-cross circuit topology using full-wave rather than half-wave rectification of the AC signal. Here, the gate voltage on the transistor 812 is not tied to ground as it is for the transistor 712 in FIG. 7. This enables an increased voltage threshold for closing the transistor 812 as compared to 712. Additionally, an input to the processor has been switched on the transistor 814 of the optical isolator 808, resulting in a vertically flipped processor input signal as seen in FIG. 10B.

Although not shown, the optical isolator 506, in an embodiment, can include many of the components and the topology of FIG. 1. For instance, the optical isolator 506 may comprise the diode 114, the LED, 106, the voltage-dropping resistor 112, the transistor 108, and the output to a controller or processor may be included in.

To account for an age of the relay 504, the processor 508 may add to the relay delay a value linearly-related to an age of the relay 504. The linear relation can be characterized and stored in the memory 514. The processor 508 can track an age or number of cycles of the relay 504 and find a corresponding delay for this age or number of cycles via the linear relation stored in the memory 514. The linear relation can be stored in the form of a lookup table or an equation (with variables for age/cycles and relay delay). The relay delay for age/cycles can then be added to the relay delay based on temperature and the combined delay can be used to trigger switching of the relay 504.

Figure 4:
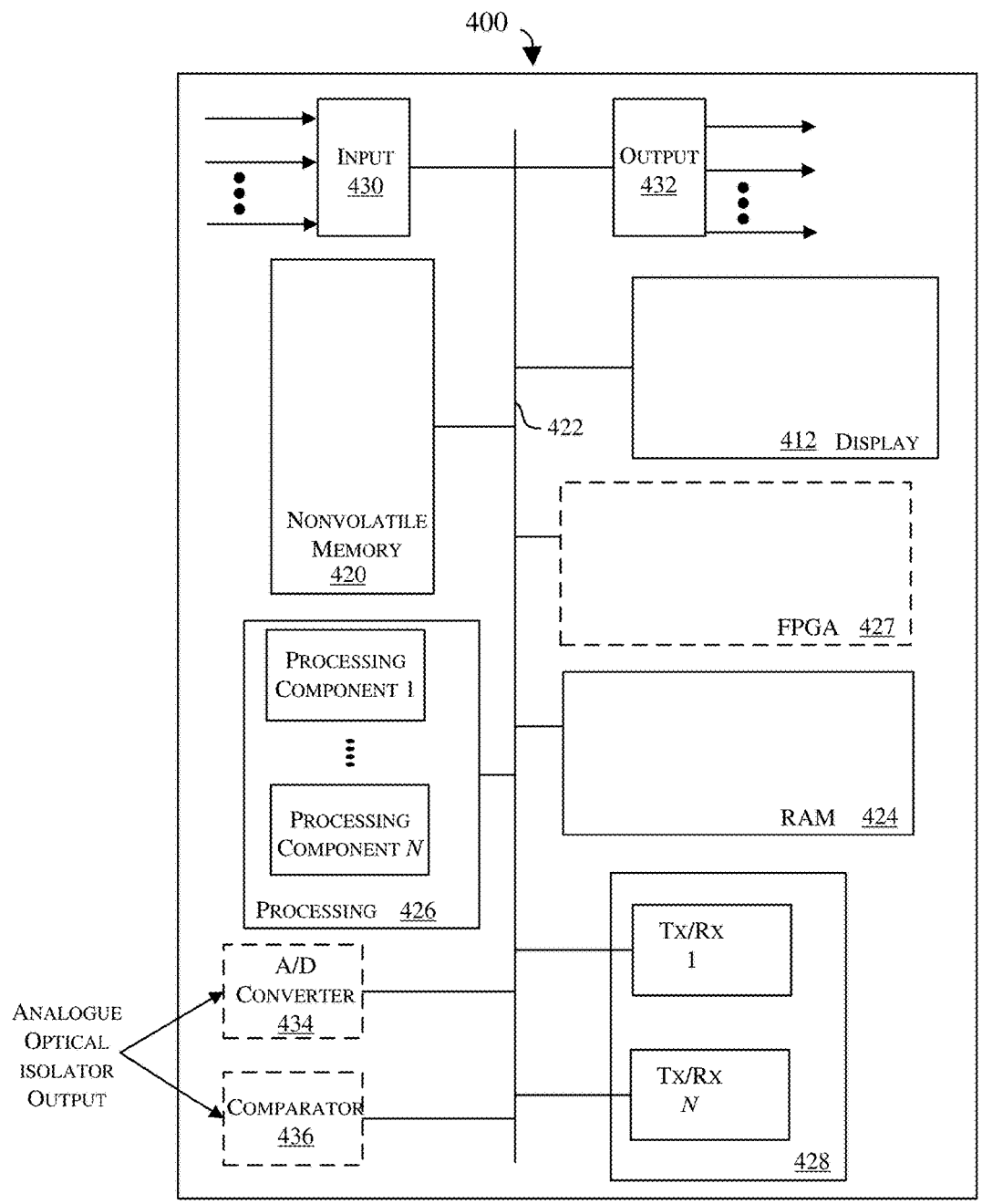
FIG. 4 illustrates a block diagram depicting physical components that may be utilized to realize the controller and a computing system encompassing the processor according to an exemplary embodiment.

The methods described in connection with the embodiments disclosed herein may be embodied directly in hardware, in processor-executable code encoded in a non-transitory tangible processor readable storage medium, or in a combination of the two. Referring to FIG. 4 for example, shown is a block diagram depicting physical components that may be utilized to realize the controller and a computing system encompassing the processor according to an exemplary embodiment. As shown, in this embodiment a display portion 412 and nonvolatile memory 420 are coupled to a bus 422 that is also coupled to random access memory ("RAM") 424, a processing portion (which includes N processing components) 426, an optional field programmable gate array (FPGA) 427, and a transceiver component 428 that includes N transceivers. Although the components depicted in FIG. 4 represent physical components, FIG. 4 is not intended to be a detailed hardware diagram; thus many of the components depicted in FIG. 4 may be realized by common constructs or distributed among additional physical components. Moreover, it is contemplated that other existing and yet-to-be developed physical components and architectures may be utilized to implement the functional components described with reference to FIG. 4.

This display portion 412 generally operates to provide a user interface for a user, and in several implementations, the display is realized by a touchscreen display. In general, the nonvolatile memory 420 is non-transitory memory that functions to store (e.g., persistently store) data and processor-executable code (including executable code that is associated with effectuating the methods described herein). In some embodiments for example, the nonvolatile memory 420 includes bootloader code, operating system code, file system code, and non-transitory processor-executable code to facilitate the execution of a method for characterizing a delay in a mechanical relay and using this information along with detection of zero crossings of an AC signal and a frequency of the AC signal to control switching of the relay at the zero crossings.

In many implementations, the nonvolatile memory 420 is realized by flash memory (e.g., NAND or ONENAND memory), but it is contemplated that other memory types may be utilized as well. Although it may be possible to execute the code from the nonvolatile memory 420, the executable code in the nonvolatile memory is typically loaded into RAM 424 and executed by one or more of the N processing components in the processing portion 426.

The N processing components in connection with RAM 424 generally operate to execute the instructions stored in nonvolatile memory 420 to enable switching of a mechanical relay at zero crossings despite a temperature and age-dependent delay in the relay's reaction to a control signal. For example, non-transitory, processor-executable code to effectuate determination of this delay and use thereof in controlling the relay may be persistently stored in nonvolatile memory 420 and executed by the N processing components in connection with RAM 424. As one of ordinarily skill in the art will appreciate, the processing portion 426 may include a video processor, digital signal processor (DSP), micro-controller, graphics processing unit (GPU), or other hardware processing components or combinations of hardware and software processing components (e.g., an FPGA or an FPGA including digital logic processing portions).

In addition, or in the alternative, the processing portion 426 may be configured to effectuate one or more aspects of the methodologies described herein (e.g., determining zero crossings, AC signal frequency, and relay delay). For example, non-transitory processor-readable instructions may be stored in the nonvolatile memory 420 or in RAM 424 and when executed on the processing portion 426, cause the processing portion 426 to perform a method for characterizing a delay in a mechanical relay and using this information along with detection of zero crossings of an AC signal and a frequency of the AC signal to control switching of the relay at the zero crossings. Alternatively, non-transitory FPGA-configuration-instructions may be persistently stored in nonvolatile memory 420 and accessed by the processing portion 426 (e.g., during boot up) to configure the hardware-configurable portions of the processing portion 426 to effectuate the functions of the controller.

The input component 430 operates to receive signals (e.g., the AC waveform or output of the optical isolator) that are used to determine a delay of the relay and trigger a control voltage to the relay such that switching occurs during zero crossings. The output component generally operates to provide one or more analog or digital signals to effectuate an operational aspect of the controller. For example, the output portion 432 may provide the control voltage that is used to switch the relay.

The depicted transceiver component 428 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

In an embodiment, an analogue output of the optical isolator can be routed to an optional analogue-to-digital converter 434 or an optional comparator 436. The optional analogue-to-digital converter 434 can convert the analogue signal to a digital signal that can be provided to the bus 422 and analyzed for zero crossings via the processing component 426 or the optional FPGA 427, and/or can be stored in the RAM 424. Alternatively, the optional comparator 436 can compare the analogue output from the optical isolator and compare it to a reference voltage and provide a digital input indicative of zero crossings of the analogue output to the processing component 426 or the FPGA 427, and/or can store the result in the RAM 424.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

As used herein, the recitation of "at least one of A, B and C" is intended to mean "either A, B, C or any combination of A, B and C." The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A method of calibrating and operating a relay device for switching AC signals through a load, wherein the method accounts for relay switching delay that changes with relay age and temperature, the method comprising:
measuring relay switching delays for two or more relays at a plurality of temperatures;
deriving a master polynomial as a best fit to the delays as a function of the temperatures, the master polynomial including variables for temperature, x, and delay, y, and a constant, C, for a y-intercept of the master polynomial;
coupling a first relay device to a calibration circuit;
measuring a calibration temperature for the first relay device;
instructing a relay of the first relay device to switch, and identifying a first time of the instructing;
monitoring a signal through the relay to determine a second time when the relay closes;
calculating a calibration delay as a time between the second time and the first time;
inserting the calibration delay and the calibration temperature into the master polynomial and solving for the constant, C, for the y-intercept to give a use polynomial having the variables, x and y, for temperature and delay;
wherein the first relay device is configured for:
installation and coupling in series with a load and an AC mains;
receiving an instruction to switch the relay;
measuring a use temperature;

inserting the use temperature into the use polynomial and solving for the delay;
detecting a first zero crossing of an AC signal from the AC mains passing through the first relay device;
determining a frequency of the AC signal; and
switching the relay at a subsequent zero crossing minus the delay, the subsequent zero crossing determined based on a time of the first zero crossing and the frequency of the AC signal.

2. The method of claim 1, wherein the first inserting and the first solving are performed via a processor of the first relay device.

3. The method of claim 1, wherein the first inserting and the first solving are performed via a processor of the calibration circuit.

4. The method of claim 1, wherein the calibration circuit is moved to a second relay device to separately calibrate the second relay device.

5. The method of claim 4, wherein the calibration circuit is only coupled to the first and second relay devices during a calibration phase.

6. The method of claim 1, wherein the relay is a mechanical relay.

7. A non-transitory, tangible computer readable storage medium, encoded with processor readable instructions to perform a method for calibrating and operating a relay device for switching AC signals through a load, wherein the method accounts for relay switching delay that changes with relay age and temperature, the method comprising:
measuring relay switching delays for two or more relays at a plurality of temperatures;
deriving a master polynomial as a best fit to the relay switching delays as a function of the plurality of temperatures, the master polynomial including variables for temperature, x, and delay, y, and a constant, C, for a y-intercept of the master polynomial;
coupling a first relay device to a calibration circuit;
measuring a calibration temperature for the first relay device;
instructing a relay of the first relay device to switch, and identifying a first time of the instructing;
monitoring a signal through the relay to determine a second time when the relay closes;
calculating a calibration delay as a time between the second time and the first time;
inserting the calibration delay and the calibration temperature into the master polynomial and solving for the constant, C, for the y-intercept to give a use polynomial having the variables, x and y, for temperature and delay;
wherein the first relay device is configured for:
installation and coupling in series with a load and an AC mains;
receiving an instruction to switch the relay;
measuring a use temperature;
inserting the use temperature into the use polynomial and solving for the delay;
detecting a first zero crossing of an AC signal from the AC mains passing through the first relay device;
determining a frequency of the AC signal; and
switching the relay at a subsequent zero crossing minus the delay, the subsequent zero crossing determined based on a time of the first zero crossing and the frequency of the AC signal.

8. The non-transitory, tangible computer readable storage medium of claim 7, wherein the first inserting and the first solving are performed via a processor of the first relay device.

9. The non-transitory, tangible computer readable storage medium of claim 7, wherein the first inserting and the first solving are performed via a processor of the calibration circuit.

10. The non-transitory, tangible computer readable storage medium of claim 7, wherein the calibration circuit is moved to a second relay device to separately calibrate the second relay device.

11. The non-transitory, tangible computer readable storage medium of claim 10, wherein the calibration circuit is only coupled to the first and second relay devices during a calibration phase.

12. The method of claim 7, wherein the relay is a mechanical relay.

* * * * *